(12) United States Patent
Thevasahayam (10) Patent No.: US 9,882,109 B2
(45) Date of Patent: Jan. 30, 2018

(54) BI-POLAR ORGANIC SEMICONDUCTORS FOR THERMOELECTRIC POWER GENERATION

(71) Applicant: EMPIRE TECHNOLOGY DEVELOPMENT LLC, Wilmington, DE (US)

(72) Inventor: Arockiadoss Thevasahayam, Tamilnadu (IN)

(73) Assignee: Empire Technology Development LLC, Wilmington, DE (US)

(*) Notice: Subject to any disclaimer, the term of this patent is extended or adjusted under 35 U.S.C. 154(b) by 0 days.

(21) Appl. No.: 14/440,842

(22) PCT Filed: Oct. 28, 2013

(86) PCT No.: PCT/IB2013/059706
§ 371 (c)(1),
(2) Date: May 5, 2015

(87) PCT Pub. No.: WO2014/072873
PCT Pub. Date: May 15, 2014

(65) Prior Publication Data
US 2015/0295156 A1    Oct. 15, 2015

(30) Foreign Application Priority Data
Nov. 6, 2012 (IN) .......................... 4640/CHE/2012

(51) Int. Cl.
*H01L 51/00* (2006.01)
*H01L 35/24* (2006.01)
(Continued)

(52) U.S. Cl.
CPC .............. *H01L 35/24* (2013.01); *H01L 35/32* (2013.01); *H01L 35/34* (2013.01)

(58) Field of Classification Search
CPC ......... H01L 35/24; H01L 35/34; H01L 35/32; H01L 27/16; H01L 51/0001; H01L 51/0583
See application file for complete search history.

(56) References Cited

U.S. PATENT DOCUMENTS 7,166,796 B2    1/2007  Nicolaou
7,455,793 B2   11/2008  Hsu et al.
(Continued)

FOREIGN PATENT DOCUMENTS

EP          0708483 A3      1/1997
WO      WO 9311565 A1      6/1993

OTHER PUBLICATIONS

Bhattacharya et al., Temperature dependence of thermal conductivity of biological tissues, *Physiological Measurement* (Jul. 4, 3002), 24(3):769-783.
(Continued)

*Primary Examiner* — Michele Fan
(74) *Attorney, Agent, or Firm* — Pepper Hamilton LLP (57) ABSTRACT

Disclosed are bi-polar semiconductor composites that include at least one organic p-type semiconductor; and at least one organic n-type semiconductor, and methods of making and using them. In particular, collagen based semiconductors may be used. The composite may be used to generate electricity from heat loss via industrial processes, such as heat lost via pipes, heat sinks, and so on.

9 Claims, 3 Drawing Sheets

(51) Int. Cl.
H01L 35/34 (2006.01)
H01L 35/32 (2006.01)

(56) References Cited

U.S. PATENT DOCUMENTS

| | | | |
|---|---|---|---|
| 8,101,846 B1 | 1/2012 | Schroeder et al. | |
| 8,242,487 B2 | 8/2012 | Prakash | |
| 8,247,264 B2 | 8/2012 | Yamate | |
| 2005/0040390 A1 | 2/2005 | Pfeiffer et al. | |
| 2006/0091797 A1 | 5/2006 | Tsutsui et al. | |
| 2006/0284169 A1 | 12/2006 | Park et al. | |
| 2008/0057355 A1* | 3/2008 | Ajiki | H01G 9/2068 429/9 |
| 2008/0087314 A1 | 4/2008 | Xiao et al. | |
| 2009/0014693 A1* | 1/2009 | Zahn | C07D 517/04 252/510 |
| 2011/0049481 A1* | 3/2011 | Xavier | B82Y 10/00 257/40 |
| 2011/0315967 A1 | 12/2011 | Schmidhal et al. | |
| 2013/0178011 A1* | 7/2013 | Ginley | H01L 31/18 438/98 |

OTHER PUBLICATIONS

Fu et al., Electrothermally driven current vortices in inhomogeneous bipolar semiconductors, *Phys. Rev. B* (Jul. 8, 2011), 84(4):045205:1-045205:6.

Venkatasubramanian et al., Thin-film thermoelectric devices with high room-temperature figures of merit, *Nature* (Oct. 11, 2001), 413:597-602.

International Search Report and Written Opinion for International Application No. PCT/IB2013/059706 dated Mar. 24, 2014.

Al-Zoubi et al., Microwave Hall Effect Measurements on Biological and Organic Semiconductors, *Journal of Physics: Conference Series* (2005), 13:430-433.

Caltech, Science and Materials Behind Thermoelectrics, originally available at http://www.its.caltech.eduk~jsnyder/thermoelectrics/science_page.htm, downloaded Apr. 17, 2015 from http://web.archive.org/web/20040811002459/http://www.its.caltech.edu/~jsnyder/thermoelectrics/science_page.htm (Aug. 11, 2004 capture), 12 pages.

Fu et al., Electrothermally Driven Current vortices in Inhomogeneous Bipolar Semiconductors, *Phys. Rev. B* (Jul. 8, 2011), 84(4):045205.

Harman et al., Quantum Dot Superlattice Thermoelectric Materials and Devices, *Science* (Sep. 27, 2002), 297(5590):2229-2232.

Pathak et al., Borane Derivatives: A New Class as Super and Hyperhalogens, *Chem Phys Chem* (Sep. 12, 2011), 12(13):2423-2428.

See et al., Water-Processable Polymer-Nanocrystal Hybrids for Thermoelectrics, *Nano Lett* (2010), 10(11):4664-4667.

The Kanatzidis Research Group, accessed at https://web.archive.org/web/20130302030325/http://chemgroups.northwestern.edu/kanatzidis/research.html, accessed on Apr. 6, 2015, pp. 1-7.

Volkswagen Shows Thermoelectric Generator for Waste Heat Recovery, accessed at https://web.archive.org/web/20101010042620/http://greencarcongress.com/2009/02/volkswagen-show.html, posted on Feb. 6, 2009, pp. 1-3.

* cited by examiner

BI-POLAR ORGANIC SEMICONDUCTORS FOR THERMOELECTRIC POWER GENERATION

CROSS-REFERENCE TO RELATED APPLICATIONS

This application is a U.S. national stage filing under 35 U.S.C. § 371 of International Application No. PCT/IB2013/059706, filed on Oct. 28, 2013, which in turn claims the benefit under 35 U.S.C. § 119(a) of Indian Patent Application No. 4640/CHE/2012, filed on Nov. 6, 2012, entitled "BI-POLAR ORGANIC SEMICONDUCTORS FOR THERMOELECTRIC POWER GENERATION," the disclosures of which are incorporated herein by reference in their entireties.

FIELD

This application relates to thermoelectric materials. More particularly, this application relates to thermoelectric materials comprising p-type semiconductors in combination with n-type semiconductors. In some embodiments, such conductors are based on organic materials such as collagen. In some embodiments, such bi-polar organic semiconductors generate electricity from heat recovery.

BACKGROUND

Low temperature waste heat recovery systems are in need by industry to improve plant efficiency, especially in the temperature range of 60-130° C. Presently, heat from these thermal sources is dissipated to the environment, potentially leading to heat pollution and waste of energy, which could be better utilized otherwise. Present thermoelectric materials used for heat recovery systems are expensive, inefficient, and require high temperature differentials. In the search for new sources of harvesting low thermal power energy, the ability to convert low temperature differences directly into electricity without wasteful intervening steps is tremendously promising.

Thus there is need for good thermoelectric material that can be easily adopted by industry (low cost) which has reasonable efficiency at such low temperatures of 60-130° C.

SUMMARY

Some embodiments provide a bi-polar semiconductor composite comprising at least one organic p-type semiconductor material; and at least one organic n-type semiconductor material.

In some embodiments, the base organic material is selected from collagen, chitosan, gelatin, cellulose, conducting polymers, sodium alginate, and combinations thereof.

In some embodiments, the organic p-type semiconductor material comprises a base organic material doped with at least one of sodium, F, Cl, Br, I, Bi, a hyperhalogen or combination thereof.

In some embodiments, the organic n-type semiconductor material comprises a base organic material doped with a multivalent transition metal.

In some embodiments, the multivalent transition metal is selected from Cd, Cu, Mg, W, Ti, Mo, P, Te, Fe, and combinations thereof.

Some embodiments provide a bipolar semiconductor composite wherein the organic p-type semiconductor material comprises a base organic material doped with sodium; and the organic n-type semiconductor material comprises a base organic material doped with a multivalent transition metal.

Some embodiments provide a bipolar semiconductor composite wherein the organic p-type semiconductor material comprises a base organic material selected from collagen, chitosan, gelatin, cellulose, conducting polymers, sodium alginate, and combinations thereof wherein the base organic material is doped with sodium; and the organic n-type semiconductor material comprises a base organic material selected from collagen, chitosan, gelatin, cellulose, conducting polymers, sodium alginate, and combinations thereof wherein the base organic material is doped with a multivalent transition metal selected from W, Ti, Mo, Cd, Cu, Mg, W, Ti, Mo, P, Te, Fe, and combinations thereof.

In some embodiments, the organic p-type semiconductor material comprises a film and the organic n-type semiconductor material comprises a film.

In some embodiments, the organic p-type semiconductor material and the organic n-type semiconductor material are physically connected to one another to form a multi-layer composite.

In some embodiments, the bipolar semiconductor composite has a thermoelectric figure of merit (ZT) of about 0.85 to about 3. The ZT depends on types of dopants used. For example, when these materials are substituted with "hyperhalogens" or transition metals like Vanadium, Tantalum, and so on, the number of holes and electrons available increases, which in-turn will increase the figure of merit, ZT. In some embodiments, the figure of merit is about 0.85 to about 1.0, in some embodiments, the figure of merit is about 0.90 to about 0.95, in some embodiments, the ZT is about 0.9 to about 2.0. In some embodiments, the ZT about 0.937. In some embodiments, the ZT is about 0.85, about 0.9, about 0.95, about 1.00, about 1.05, about 1.10, about 1.15, about 1.20, about 1.25, about 1.30, about 1.35, about 1.40, about 1.45, about 1.50, about 1.55, about 1.60, about 1.65, about 1.70, about 1.75, about 1.80, about 1.85, about 1.90, about 1.95, about 2.00, about 2.05, about 2.10, about 2.15, about 2.20, about 2.25, about 2.30, about 2.35, about 2.40, about 2.45, about 2.50, about 2.55, about 2.60, about 2.65, about 2.70, about 2.75, about 2.80, about 2.85, about 2.90, about 2.95, about 3.00 and ranges between any two of these values.

Some embodiments provide a method of making an organic bipolar semiconductor, the method comprising providing a thin film of organic n-type semiconductor material; providing a thin film of organic p-type semiconductor material; and joining the thin film of organic n-type semiconductor material to the thin film of organic p-type semiconductor material.

Some embodiments provide for preparing a thin film of the organic n-type semiconductor material by contacting a first base organic material with an acidic solution to yield a colloidal solution, adding a donor solution comprising a divalent transition metal to the colloidal solution to yield an organic n-type semiconductor material, and forming the organic n-type semiconductor material into a thin film.

Some embodiments provide for preparing a thin film of the organic p-type semiconductor material by contacting a second base organic material with an acidic solution to yield a second colloidal solution, adding an acceptor solution comprising sodium, F, Cl, Br, I, Bi, a hyperhalogen or combination thereof to the second colloidal solution to yield an organic p-type semiconductor material, and forming the organic p-type semiconductor material into a thin film.

In some embodiments, the joining step further comprises wetting a surface of one of the thin film or organic n-type semiconductor material or the thin film of organic p-type semiconductor material; contacting the wetted surface with a surface of the other organic thin film semiconductor material to form a bipolar semiconductor.

Some embodiments provide a method of using a bipolar semiconductor to capture energy from heat loss, the method comprising providing a bipolar semiconductor comprising an organic p-type semiconductor material and an organic n-type semiconductor material; and placing the bipolar semiconductor in contact with a heat source.

Some embodiments further provide for electrically coupling the bipolar semiconductor to a load, including any electronic system, including but not limited to low power automation devices, low power control systems, low power lighting, and so on.

Some embodiments provide for electrically coupling the bipolar semiconductor to an energy storage device. The energy storage device can for example be a battery.

In some embodiments, the heat source is selected from pipes, ducts, conduits, exhaust systems, electrical devices, ballasts, electrical chargers, electrical converters, heat sinks, sources of magnetic flux, and so on.

BRIEF DESCRIPTION OF THE DRAWINGS

The drawings submitted herewith show some embodiments or features of some embodiments encompassed by the disclosure. The drawings are meant to be illustrative and are not intended to be limiting. Like reference numerals refer to like elements through the drawings.

DETAILED DESCRIPTION

The challenge in any effort to discover new thermoelectric (TE) materials lies in achieving simultaneously high electronic conductivity, high thermoelectric power and low thermal conductivity in the same solid.

These properties define the thermoelectric figure of merit. The figure of merit represents the quality of performance of a thermoelectric material. Sometimes it is multiplied by temperature and represented as ZT. ZT can be expressed two ways either as a function of conductivity (s) or resistivity (p):

$$ZT = (S^2 s/k)T$$

where $\alpha$ is the thermopower, s is the electronic conductivity, k is the thermal conductivity, and T is the temperature, or:

$$ZT = \frac{\alpha}{\rho k} T$$

where $\alpha$ is the Seebeck Coefficient, $\rho$ is the electrical resistivity, k is the thermal conductivity, and T is the temperature.

Thermopower, electronic conductivity/resistivity, the Seebeck Coefficient, and thermal conductivity are determined by the details of the electronic structure and scattering of charge carriers (electrons or holes) and thus are not independently controllable parameters.

Materials with higher ZT than those attainable with more traditional semiconductor materials are desirable. The least well understood problem is how to increase the thermopower of a material without decreasing the electronic conductivity and how to predict precisely which materials will have very large thermopower.

The most commonly used semiconductor for thermoelectric applications is $Bi_2Te_3$ because of its relatively high figure of merit. However, the performance of this material is still relatively low and alternate materials are being investigated with possibly better performance.

A new thermoelectric material using organic semiconductor materials is described herein. A p-type semiconductor (p for positive) is typically obtained by carrying out a process of doping by adding a certain type of atoms (acceptors) to a semiconductor in order to increase the number of free charge carriers (in this case positive holes).

An N-type semiconductor is a type of extrinsic semiconductor where dopant atoms (donors) are capable of providing extra conduction electrons to the host material. This creates an excess of negative (n-type) electron charge carriers.

Described herein are organic based p-type semiconductor materials, organic based n-type semiconductor materials, and devices made from combinations of such conductors.

In an embodiment, a bi-polar semiconductor composite may include at least one organic p-type semiconductor material, and at least one organic n-type semiconductor material.

Any suitable organic material may be used as the base organic material for either or both of the organic based p-type semiconductor materials and the organic based n-type semiconductor materials used herein. For example, the base organic material is selected from collagen, chitosan, gelatin, cellulose, conducting polymers, sodium alginate, and combinations thereof. In some embodiments, particularly those described in further detail herein, the base organic material is collagen. The base organic material used in each semiconductor type in a given device employing both p-type and n-type semiconductors may be the same or different. In some embodiments, the base organic material used in both semiconductor materials is the same.

Generally, in accordance with some embodiments, an organic p-type semiconductor is obtained by doping the base organic material with at least one of sodium, F, Cl, Br, I, Bi, a hyperhalogen, or a combination thereof. In some embodiments, the organic p-type semiconductor material may include a base organic material selected from collagen, chitosan, gelatin, cellulose, conducting polymers, sodium alginate, and combinations thereof, wherein the base organic material is doped with at least one of sodium, F, Cl, Br, I, Bi, a hyperhalogen or a combination thereof.

In some embodiments, an organic p-type semiconductor material based on collagen is obtained by doping collagen with sodium. Metallic alkali, such as NaOH, can be used in an aqueous solution for doping.

Generally, in accordance with some embodiments, an organic n-type semiconductor material may include a base organic material doped with a multivalent transition metal. The multivalent transition metal can be selected from Cd, Cu, Mg, W, Ti, Mo, P, Te, Fe, and combinations thereof. In some embodiments, the organic n-type semiconductor material may include a base organic material selected from collagen, chitosan, gelatin, cellulose, conducting polymers, sodium alginate, and combinations thereof, wherein the base organic material is doped with a multivalent transition metal selected from Cd, Cu, Mg, W, Ti, Mo, P, Te, Fe, and combinations thereof.

In some embodiments, the organic p-type semiconductor material includes a base organic material doped with sodium, and the organic n-type semiconductor material includes a base organic material doped with a multivalent transition metal.

In some embodiments, the organic p-type semiconductor material may include a base organic material selected from collagen, chitosan, gelatin, cellulose, conducting polymers, sodium alginate, and combinations thereof; the base organic material is doped with sodium; and the organic n-type semiconductor material may include a base organic material selected from collagen, chitosan, gelatin, cellulose, conducting polymers, sodium alginate, and combinations thereof, wherein the base organic material is doped with a multivalent transition metal selected from W, Ti, Mo, Cd, Cu, Mg, W, Ti, Mo, P, Te, Fe, and combinations thereof. In some embodiments, an organic n-type semiconductor material is obtained by doping collagen with Cd. For example, the metallic salt $CdCl_2$ can be used in an aqueous solution. Other metallic salts could also be used to avoid Cd which is being banned by Europe and other countries, for example, Cu in $CuSO_4$, and Mg in $MgSO_4$, $MgCl_2$, and so on.

The organic p-type semiconductor and the organic n-type semiconductor may each be formed into a film. In some embodiments, the organic p-type semiconductor material includes a film and the organic n-type semiconductor material includes a film. The forming of the organic p-type semiconductor material and the organic n-type semiconductor material into films may be performed by various methods, for example, by spreading, spin-coating, spraying, or a combination thereof. The films may be formed onto a substrate. The substrate can be a temporary substrate from which the films may be removed after forming, and transferred to a desired location such as a heat source. Alternatively, the substrate can be the heat source, in which case, the organic p-type semiconductor material and the organic n-type semiconductor material may be formed directly on the heat source using the methods described herein.

Once the organic semiconductor materials are formed, the two organic semiconductor materials can be layered over each other or can be physically placed over each other. In some embodiments, the organic p-type semiconductor material and the organic n-type semiconductor material can be physically connected to one another to form a multi-layer composite. Since these layers are not chemically bonded but physically connected, there is no electron hole recombination, which ensures longevity of the material. A bi-polar semi-conductor composite is formed. When one of the sides of this composite sandwich is exposed to a hot surface, a natural thermal gradient is induced in both p-type and n-type material. The combinations of movement of charges, namely drifts induced by the electric field, result in diffusion of charges into a depletion layer, and the presence of thermal gradient results in the proposed organic semiconducting device behavior as a thermoelectric material.

At the junction where the oppositely doped organic semiconducting layers meet, a P-N junction is formed. Electrons from the N-type layer diffuse across the physical boundary towards the P-type layer while holes move in the opposite direction, forming a depletion layer in both the semiconducting films.

Given the high density of mobile electrons at the surface of the N-type layer and the high density of mobile holes at the surface of the P-type layer, but few mobile charges in the depletion layer, the electric field is strongest near the junction. This deep layer has profound effects, when a heat gradient is applied to the sandwiched junction organic semiconducting layers.

Charges can move in at least three different ways, via a diffusion current, a drift current, or a thermoelectric current. In a diffusion current, particles move from denser areas to less dense areas. A drift current results from the voltage bias, the electric field. A thermoelectric current is another form of drift current in which charge carriers move from the hotter end of the device to the cooler end. Thermoelectric currents result from the addition of a physical parameter, heat. A typical oppositely doped semiconducting junction device as described herein results in a diffusion current forming away from the dense charge areas, and drift current forming due to the electric field, and thermal gradient-induced current. The electric field sets up a drift current from the negatively charged top layer toward the positively charged bottom layer of the device—moving against the diffusion currents of the charge carriers. Meanwhile the heat gradient sets up a drift current at right angles to the electric field. In these conflicting perpendicular forces, electrons and holes cannot maintain straight motion but are drawn into vortices or whirlpools. Instead of a single vertical vortex in the device, vortices form in each layer and are separated by the depletion layer. In the N-type layer, the widely separated electrons near the depletion layer move with the temperature gradient, from hot to cold, but move in the opposite direction near the surface, where the electrons are bunched closer together. The vortex formed by holes in the N-type layer is nearly a mirror image of the electron vortex.

Figure 3:
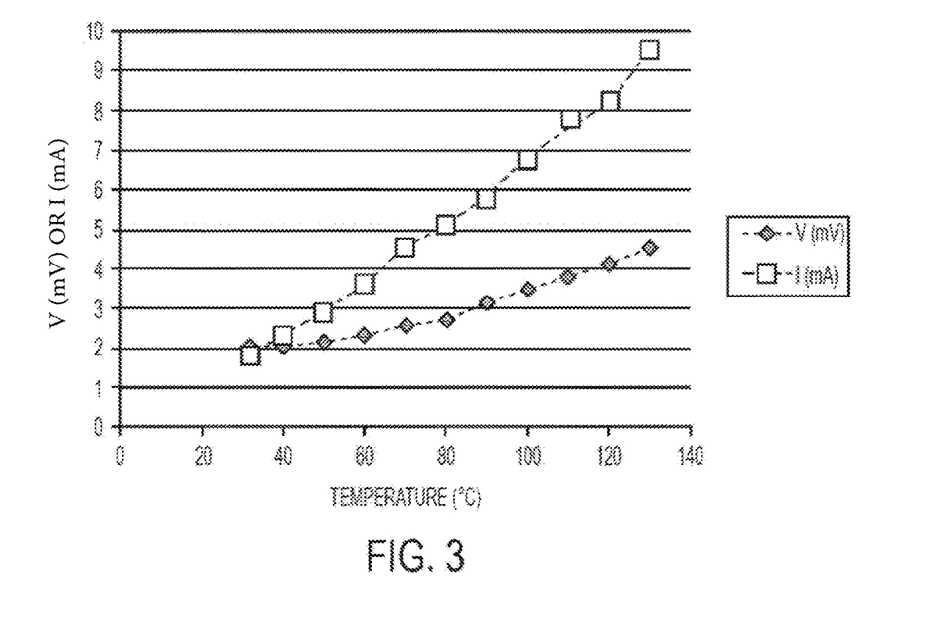
FIG. 3 is a graph depicting current and voltage as a function of temperature generated through one embodiment of an organic bipolar semiconductor. The x-axis is temperature in degrees C., and the Y-axis is either mA (square-shaped symbols) or mV (diamond-shaped symbols).

By merely applying heat to one end of this simple organic semiconducting junction device, a magnetic field perpendicular to the twin vortices is generated—a magnetic field that emerges at right angles to the plane of the two semiconducting layers. This is similar to the right hand rule in electromagnetics, except that the thermal force/gradient replaces the mechanical force. Thus electrical power can be harvested with this organic thermoelectric material. As shown in FIG. 3 showing current vs. temperature.

Figure 1:
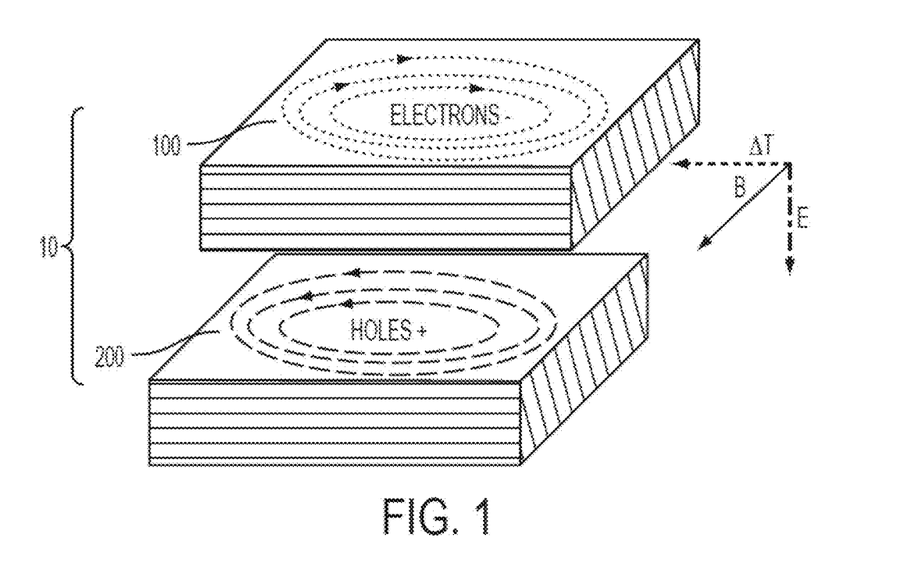
FIG. 1 is a schematic view of an embodiment of an organic bipolar semiconductor.
Figure 2:
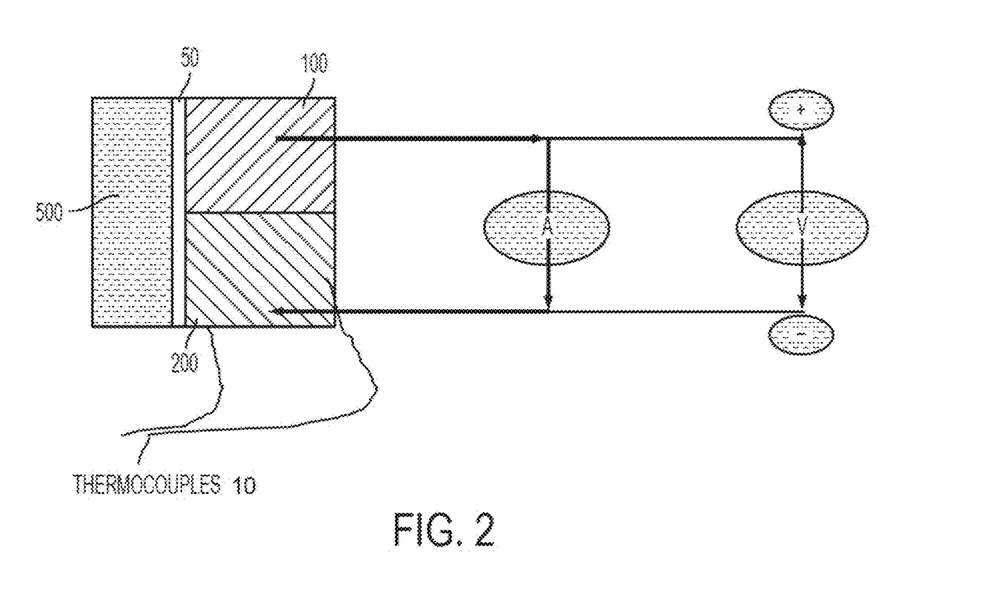
FIG. 2 is a schematic of an experimental set up for an organic bipolar semiconductor.

With reference to FIG. 1, a bipolar semiconductor includes an organic n-type semiconductor 100 adjacent an organic p-type semiconductor 200, which creates a vertical electric field (indicated by arrow E), while diffusion creates a depletion layer (not shown) near the junction of the two semiconductor layers, where the electric field is strongest. The two semiconductor layers may be joined by any suitable means, including but not limited to thermal adhesive tape 50 as depicted in FIG. 2. The bipolar semiconductor 10 contacts a heat source 500, for example, industrial piping, along one of edges X, X', Y, Y'. For example, FIG. 2 shows edge X in contact with the heat source 500. Heating one end (for example, edge X) of the device creates a heat gradient at right angles to the electric field (indicated by arrow ΔT), whereby the temperature at the contact point (for example, edge X) is greater than at the opposite end (for example, edge X'). Electrons and holes moving in these fields are forced into loops of current, and a magnetic field is generated "sideways" (indicated by arrow B), at right angles to both electric and thermal fields. This can be explained by the formation of the voltage across a bipolar semiconductor junction due to the current flow accounting for the energy band bending near the semiconductor surfaces. FIG. 2 shows an experimental setup with the semiconductors 100 and 200 connected to thermocouples 10 for monitoring temperature and also operatively coupled to measure harvestable energy created.

In some embodiments, the bipolar semiconductor composite has a thermoelectric figure of merit (ZT) of about 0.85 to about 3.0. The ZT depends on types of dopants used. For example, when these materials are substituted with "hyperhalogens" or transition metals like Vanadium, Tantalum, and so on, the number of holes and electrons available increases, which in-turn will increase the figure of merit, ZT. In some embodiments, the figure of merit is about 0.85 to about 1.0, in some embodiments, the figure of merit is about 0.90 to about 0.95, in some embodiments, the ZT is about 0.9 to about 2.0. In some embodiments, the ZT about 0.937. In some embodiments, the ZT is about 0.85, about 0.9, about 0.95, about 1.00, about 1.05, about 1.10, about 1.15, about 1.20, about 1.25, about 1.30, about 1.35, about 1.40, about 1.45, about 1.50, about 1.55, about 1.60, about 1.65, about 1.70, about 1.75, about 1.80, about 1.85, about 1.90, about 1.95, about 2.00, about 2.05, about 2.10, about 2.15, about 2.20, about 2.25, about 2.30, about 2.35, about 2.40, about 2.45, about 2.50, about 2.55, about 2.60, about 2.65, about 2.70, about 2.75, about 2.80, about 2.85, about 2.90, about 2.95, about 3.00 and ranges between any two of these values.

In some embodiments, a method of preparing an organic bipolar semiconductor may include providing a thin film of organic n-type semiconductor material, providing a thin film of organic p-type semiconductor material, and joining the thin film of organic n-type semiconductor material to the thin film of organic p-type semiconductor material.

The organic n-type semiconductor material may be prepared by contacting a first base organic material with an acidic solution to yield a colloidal solution, and adding a donor solution that includes a divalent transition metal to the colloidal solution to yield an organic n-type semiconductor material. The organic n-type semiconductor material can be further formed into a film. As described herein, the film may be formed by various methods, for example, by spreading, spin-coating, spraying, or a combination thereof. The films may be formed onto a temporary substrate or directly onto a heat source as described herein. The first base organic material and the divalent transition metal may be as described herein. In an embodiment, the first base organic material is collagen and the divalent transition metal is Cd.

The organic p-type semiconductor material may be prepared by contacting a second base organic material with an acidic solution to yield a second colloidal solution, and adding an acceptor solution that includes sodium, F, Cl, Br, I, Bi, a hyperhalogen or combination thereof to the second colloidal solution to yield an organic p-type semiconductor material. The organic p-type semiconductor material can be further formed into a film. As described herein, the film may be formed by various methods, for example, by spreading, spin-coating, spraying, or a combination thereof. The films may be formed onto a temporary substrate or directly onto a heat source as described herein. The second base organic material may be as described herein. and the divalent transition metal may be as described herein. The acceptor solution may include sodium, F, Cl, Br, I, Bi, a hyperhalogen or a combination thereof. In an embodiment, the second base organic material is collagen and the divalent transition metal is sodium.

The joining of the organic n-type semiconductor material to the organic p-type semiconductor material may include wetting a surface of one of the thin film of organic n-type semiconductor material or the think film of organic p-type semiconductor material, and contacting the wetted surface with a surface of the other thin film of organic semiconductor material to form a bipolar semiconductor. Either or both of the organic n-type semiconductor material or the organic p-type semiconductor material can be dried prior to joining. The drying can for example be performed by lyophilization.

In some embodiments, the bipolar semiconductor material can be used to capture energy from heat loss by a heat source. The bipolar semiconductor that includes an organic p-type semiconductor material and an organic n-type semiconductor material, can be placed in contact with the heat source. The bipolar semiconductor can be further electrically coupled to a load, such as power automation devices, low power control systems, low power lighting, or combinations thereof. The bipolar semiconductor may also be electrically coupled to an energy storage device. The energy storage device can for example be a battery.

Since these p-/n-type semiconductor sandwiches can be mass manufactured as films, they can be wound on hot fluidic surfaces 500 (for example, pipes) typically encountered in process industries that emit or radiate low temperature thermal heat. Such low temperature thermal heat can be captured and converted to electrical power. Such electrical power can be used for many purposes, including, but not limited to, low powered devices for automation and control, particularly at or near the heat source. In some embodiments, the heat source is selected from pipes, ducts, conduits, exhaust systems, electrical devices, ballasts, electrical chargers, electrical converters, heat sinks, sources of magnetic flux, and so on. The bipolar semiconductor can also be stable over extended periods of time (for example, over at least a period of 9 months) without exhibiting degradation in performance.

Figure 4:
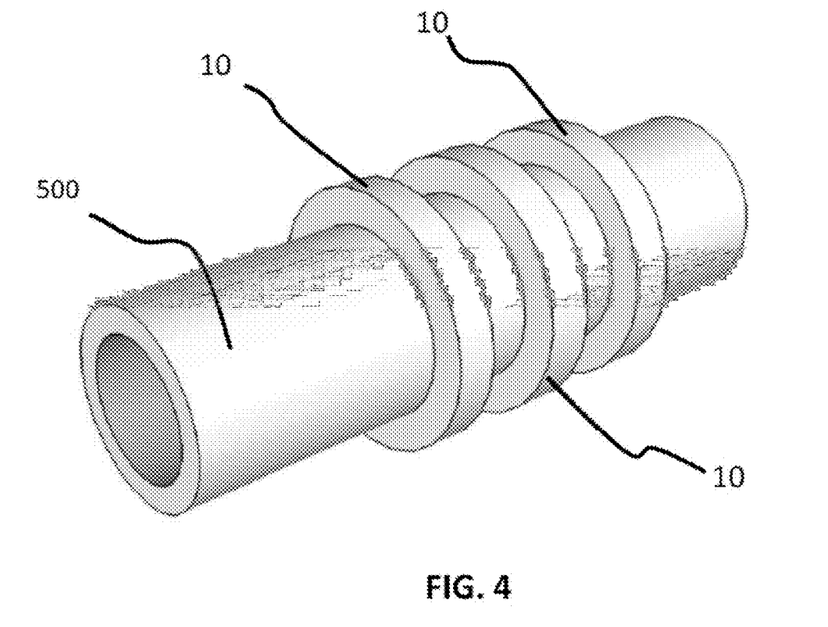
FIG. 4 is a perspective view of one embodiment of the bi-polar semiconductor employed on a pipe.

FIG. 4 shows one exemplary arrangement where a bipolar semiconductor film 10 containing adjacent n-type semiconductor material 100 and p-type semiconductor material 200 is wrapped around a pipe 500, for harvesting energy. The pipe can be any pipe transporting hot fluid therethrough, such as a hot water pipe, an exhaust pipe or flue, and so on. As shown the film is arranged in multiple adjacent annular rings. As shown in the cross section of FIG. 2, in each ring, the n-type semiconductor material 100 and the p-type semi-conductor material both contact the heat source 500. In another embodiment, the film could be wrapped as a continuous spiral (not shown) along the desired length of the pipe 500. As shown, the annular rings are separated for illustrative purposes, each adjacent ring or spiral turn may be in contact with one or more adjacent rings or spiral turns, or in a spaced apart arrangement as depicted. The energy is harvested and transported via conductors such as conductive wires 600, in operable communication with the semiconductors and an electronic system 610 or device, such as but not limited to a storage device or battery, or electrical load.

EXAMPLES

Example 1: Preparation of Collagen Based Bipolar Semiconductor Composite

The following examples can be modified to prepare an organic bipolar semiconductor composite using a variety of materials consistent with the description above. Although the examples are directed to specific embodiments, the description herein is not limited to these embodiments.

Example 1a: Preparation of N-Type Semiconductor

Step 1. 5 g of collagen was placed in 100 ml of acetic acid having a molar concentration of 0.1 M and stirred continuously for 6 hours. This swelled the (colloidal solution) collagen to 3-5 times its volume. This was done to dissolve the fibrous collagen so that doping becomes easier.

Step 2. 10 ml of 1 Molar concentration $CdCl_2$ metallic salt was prepared, using water as a polar solvent.

Step 3. This prepared $CdCl_2$ metallic solution was added slowly to the swelled (colloidal solution) collagen of step 1, until a pH of 4 is attained, by crosschecking the pH simultaneously using commercially available pH paper.

Step 4. This prepared metal doped collagen was dialyzed against salt using deionized water—this was done to ensure that there are no undoped/left out salts.

Step 5. The material from step 4 was lyophilized and used as n-type semiconductor. This was done to ensure that there are no impurities and undoped metallic salt.

Example 1b: Preparation of P-Type Semiconductor

Step 1. 5 g of collagen was placed in 100 ml of acetic acid having a molar concentration of 0.1 M and stirred continuously for 6 hours. This swelled the (colloidal solution) collagen to 3-5 times its volume. This was done to dissolve the fibrous collagen so that doping becomes easier.

Step 2. 10 ml of 1 Molar concentration NaOH alkaline solution was prepared, using water as a polar solvent.

Step 3. This prepared NaOH alkaline solution was added slowly to the swelled (colloidal solution) collagen of step 1, until a pH of 7.4 is attained, by crosschecking the pH simultaneously using commercially available pH paper.

Step 4. This prepared sodium-doped collagen was dialyzed using deionized water. This was performed to ensure that there are no undoped/left out materials.

Step 5. The material from step 4 was lyophilized and used as p-type semiconductor. This was performed to ensure that there were no impurities and undoped alkaline material.

Example 1c: Lyophilization Process

The above solutions were kept in the lyophilization flask and connected to the arm of the lypholizer equipment. (Labconco Freezone 6 liter model). After reaching a pressure of $10^{-3}$ bar vacuum the connection to the flask was opened. This environment was continued for a duration of 24 hours, at $-23°$ C. The flask was removed and the (n/p type) doped collagen materials thus obtained were used for making thin films described below.

Example 1d: Preparation of P-Type And N-Type Thin-Films

Two hollow molds of size 3.5 cm×8 cm of 1 cm using transparent acrylic material were prepared for making the two types of organic semiconducting thin films described below.

Step 1. Take 3 g of p-type collagen and add 10 ml of 0.01 Molar acetic acid and stir the solution continuously for 1 hour. This solution was poured over a prepared mold of desired dimensions. This mold was kept in an oven at 50° C. for one day. This gave a p-type organic semiconductor thin film.

Step 2. Take 3 g of n-type collagen and add 10 ml of 0.01 Molar acetic acid and stir the solution continuously for 1 hour. This solution was poured over a prepared mold of desired dimensions. This mold was kept in an oven at 50° C. for one day. This gave an n-type organic-semiconductor thin film.

Example 1e: Making an Organic n-type/p-type Semiconductor Composite Device: Making A Junction 1 ml of water was evenly spread over the p-type thin film prepared above. N-type film, prepared above, was placed over the p-type thin film and bonded together with a tape. This was placed in an oven at 50° C. for 30 minutes. Thus a sandwich junction was obtained, resulting in an organic n-type/p-type semiconductor composite device.

Example 2: Performance Evaluation of Organic n-type/p-type Semiconductor Composite Device The composite device as prepared in Example 1 was made in the form of sheets and placed over a heat source.

For the results and related performance evaluation and discussion, the prepared organic semiconducting sandwich junction of 3.5 cm×8 cm of thickness 4 micron mm was used in the experiments. The sheet was attached to the heat source using Dow Corning's DA 6534 adhesive tape. (see FIG. 2 for a schematic of the test set up.)

Voltage and impedance data was collected and is represented in FIG. 3.

The figure of merit, ZT, represents the quality of performance of a thermoelectric material, sometimes it is multiplied by temperature (Kelvin), thus, ZT. ZT is computed as a function of electrical resistivity. Thus, $$ZT = \left(\frac{\alpha}{\rho k}\right)T$$

Where, for the exemplary device, $\rho$ (0.082215 $\Omega$m) is the electrical resistivity, k is the thermal conductivity (0.829 W/(mK)), and $\alpha$ (0.00235 V/K) is the Seebeck Coefficient.

| Characteristic Units | |
| --- | --- |
| X (width) | 3.5 cm |
| Y (length) | 8 cm |
| H (height) | 0.04 cm |
| Area | 28.0 cm$^2$ |

Thermal conductivity k of doped collagen as measured was 0.829 (method adopted as described in *Physiol. Meas.* 24 (2003) 769-783; Literature reported thermal conductivity values are approximately 0.68 for pure collagen (*Physiol. Meas.* 24 (2003) 769-783). The increase in thermal conductivity (+0.149) is attributed to the presence of doped materials in both n-type and p-type collagen.

Thus for the bulk collagen material, based on the values the figure of merit, ZT, was 0.937 at 100° C.

| Temp in K (i.e. ° C. + 273) | ZT |
| --- | --- |
| 305 | 0.766 |
| 313 | 0.786 |
| 323 | 0.811 |
| 333 | 0.836 |
| 343 | 0.861 |
| 353 | 0.886 |
| 363 | 0.912 |
| 373 | 0.937 |

| Temp in K (i.e. ° C. + 273) | ZT |
|---|---|
| 383 | 0.962 |
| 393 | 0.987 |
| 403 | 1.01 |

For highly efficient thermoelectric material, low electrical resistivity and thermal conductivity are required for high figure of merit. These values are temperature dependent; therefore, the figure of merit is temperature dependent. P and N type material have different figures of merit and are averaged to determine the material's overall quality. The high ZT values obtained herein are significantly higher than otherwise obtainable, and are achieved by use of a low-cost and scalable process.

It is believed that the ZT of 0.937 can be improved upon by using hyperhalogens and multivalent transition metals. The low power can be explained by the fact that the doped materials Na, Cd used in this study have low valency. When these materials are substituted with "hyperhalogens" and transition metals like Vanadium, Tantalum, and so on, the number of holes and electrons available increase, which in-turn will increase the figure of merit—"ZT" considerably. This ZT of 0.937 can be considerably improved by using hyperhalogens and/or multivalent transition metals.

Example 3: Performance Evaluation of Organic n-type/p-type Semiconductor Composite Device Over an Extended Period of Time The performance evaluation as described in Example 2 was performed on the same composite device on a monthly basis for a period of 9 months. The composite device was tested over a temperature range of 85° C. to 145° C.

It was observed that the figure of merit, ZT, of the composite device had remained substantially the same, and had not deteriorated over the period of 9 months. Therefore, the composite device had exhibited stability over the extended period of time without degradation in performance.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "comprises" should be interpreted as "includes but is not limited to," and so on.)

It should also be understood, that although various compounds, compositions, methods, and devices are described in "open" terms of "comprising," "including," or "having" various components or steps (interpreted as meaning "including, but not limited to"), the compounds, compositions, methods, and devices can also "consist essentially of" or "consist of" the various components and steps, and such terminology should be interpreted as defining essentially closed-member groups. This paragraph is not meant in any way to limit the meaning of "comprising", "having," or "including" (and other verb forms thereof), which are to be interpreted as open-ended phrases meaning "including but not limited to" consistent with patent law and custom. The intent of this paragraph is merely to indicate that the closed-member groups defined by the "consisting of" or "consisting essentially of" language are lesser included groups within the open-ended descriptions and to provide support for claims employing the "consisting of" or "consisting essentially of" language.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, and so on" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, and so on). In those instances where a convention analogous to "at least one of A, B, or C, and so on" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, and so on). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group. As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, and so on. As a non-limiting example, each range discussed herein can be readily broken down into a lower third, middle third and upper third, and so on. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 substituents refers to groups having 1, 2, or 3 substituents. Similarly, a group having 1-5 substituents refers to groups having 1, 2, 3, 4, or 5 substituents, and so forth.

What is claimed is:

1. A method to prepare an organic bipolar semiconductor, the method comprising:
   providing a thin film organic n-type semiconductor material;
   providing a thin film organic p-type semiconductor material,
   wherein the thin film organic p-type semiconductor material comprises a first base organic material selected from at least one of collagen, chitosan, gelatin, cellulose, sodium alginate, and combinations thereof, and wherein the first base organic material is doped with at least one of Na, F, Cl, Br, I, Bi, a hyperhalogen, and combinations thereof; and
   joining the thin film organic n-type semiconductor material to the thin film organic p-type semiconductor material, wherein the providing the thin film organic n-type semiconductor material includes:
   preparing the thin film organic n-type semiconductor material by:
      contacting a second base organic material with an acidic solution to yield a colloidal solution;
      adding a donor solution comprising a multivalent transition metal to the colloidal solution to yield the organic n-type semiconductor material; and
      forming the organic n-type semiconductor material into a thin film.

2. The method of claim 1, wherein the adding the donor solution comprising the multivalent transition metal includes:
   adding a donor solution that comprises a multivalent transition metal, which is selected from a group consisting of Cd, Cu, Mg, W, Ti, Mo, P, Te, Fe, and combinations thereof, to the colloidal solution to yield the n-type organic semiconductor material.

3. An organic bipolar semiconductor prepared according to the method of claim 1.

4. A method to prepare an organic bipolar semiconductor, the method comprising:
   providing a thin film organic n-type semiconductor material,
   wherein the providing the thin film organic n-type semiconductor material includes preparing the thin film organic n-type semiconductor material by:
      contacting collagen with an acidic solution to yield a colloidal solution;
      adding a donor solution comprising Cd to the colloidal solution to yield the organic n-type semiconductor material; and
      forming the organic n-type semiconductor material into a thin film;
   providing a thin film organic p-type semiconductor material,
   wherein the organic p-type semiconductor material comprises a first base organic material selected from a group consisting of collagen, chitosan, gelatin, cellulose, conductive polymers, sodium alginate, and combinations thereof, and wherein the first base organic material is doped with at least one of Na, F, Cl, Br, I, Bi, a hyperhalogen, and combinations thereof; and
   joining the thin film organic n-type semiconductor material to the thin film organic p-type semiconductor material.

5. An organic bipolar semiconductor prepared according to the method of claim 4.

6. A method to prepare an organic bipolar semiconductor, the method comprising:
   providing a thin film organic n-type semiconductor material;
   providing a thin film organic p-type semiconductor material,
   wherein the thin film organic p-type semiconductor material comprises a first base organic material selected from at least one of collagen, chitosan, gelatin, cellulose, sodium alginate, and combinations thereof, and wherein the first base organic material is doped with at least one of Na, F, Cl, Br, I, Bi, a hyperhalogen, and combinations thereof; and
   joining the thin film organic n-type semiconductor material to the thin film organic p-type semiconductor material, wherein the providing the thin film organic p-type semiconductor material includes:
   preparing the thin film organic p-type semiconductor material by:
      contacting the first base organic material with an acidic solution to yield a colloidal solution;
      adding an acceptor solution, which comprises at least one of Na, F, Cl, Br, I, Bi, a hyperhalogen, and a combination thereof, to the colloidal solution to yield the organic p-type semiconductor material; and
      forming the organic p-type semiconductor material into a thin film.

7. The method of claim 6, wherein the joining comprises:
   wetting a surface of one of the thin film organic n-type semiconductor material or the thin film organic p-type semiconductor material; and
   contacting the wetted surface with a surface of another of the organic n-type semiconductor material or the thin film organic p-type semiconductor material to form the organic bipolar semiconductor.

8. A method to prepare an organic bipolar semiconductor, the method comprising:
   providing a thin film organic n-type semiconductor material;
   providing a thin film organic p-type semiconductor material,
   wherein the thin film organic p-type semiconductor material comprises a first base organic material selected from at least one of collagen, chitosan, gelatin, cellulose, sodium alginate, and combinations thereof, and wherein the first base organic material is doped with at least one of Na, F, Cl, Br, I, Bi, a hyperhalogen, and combinations thereof;
   drying either or both of the organic n-type semiconductor material or the organic p-type semiconductor material; and
   joining the thin film organic n-type semiconductor material to the thin film organic p-type semiconductor material, wherein the drying is performed prior to the joining, and wherein the drying comprises drying either or both of the organic n-type semiconductor material or the organic p-type semiconductor material by lyophilization.

9. An organic bipolar semiconductor prepared according to the method of claim 8.

* * * * *

UNITED STATES PATENT AND TRADEMARK OFFICE
CERTIFICATE OF CORRECTION

PATENT NO. : 9,882,109 B2  
APPLICATION NO. : 14/440842  
DATED : January 30, 2018  
INVENTOR(S) : Thevasahayam Page 1 of 1

It is certified that error appears in the above-identified patent and that said Letters Patent is hereby corrected as shown below:

In the Specification

In Column 3, Line 54, delete "(p):" and insert -- ($\rho$): --, therefor.

In Column 3, Line 58, delete "α" and insert -- S --, therefor.

In Column 7, Line 57, delete "herein. and" and insert -- herein, and --, therefor.

In Column 7, Line 66, delete "think film" and insert -- thin film --, therefor.

In Column 9, Line 41, delete "lypholizer" and insert -- lyophilizer --, therefor.

In Column 10, Line 36, delete "Where, for" and insert -- where, for --, therefor.

In Column 12, Line 13, delete "recitation no" and insert -- recitation, no --, therefor.

In Column 12, Line 35, delete "general such" and insert -- general, such --, therefor.

In Column 12, Line 42, delete "general such" and insert -- general, such --, therefor.

Signed and Sealed this  
Twenty-fourth Day of April, 2018

Andrei Iancu  
*Director of the United States Patent and Trademark Office*